(12) United States Patent
Hecht

(10) Patent No.: US 12,278,654 B2
(45) Date of Patent: Apr. 15, 2025

(54) METHOD FOR COMPRESSION OF TIME TAGGED DATA FROM TIME CORRELATED SINGLE PHOTON COUNTING

(71) Applicant: LEICA MICROSYSTEMS CMS GMBH, Wetzlar (DE)

(72) Inventor: Frank Hecht, Wetzlar (DE)

(73) Assignee: LEICA MICROSYSTEMS CMS GMBH, Wetzlar (DE)

( * ) Notice: Subject to any disclaimer, the term of this patent is extended or adjusted under 35 U.S.C. 154(b) by 253 days.

(21) Appl. No.: 18/026,644

(22) PCT Filed: Sep. 20, 2021

(86) PCT No.: PCT/EP2021/075779
§ 371 (c)(1),
(2) Date: Mar. 16, 2023

(87) PCT Pub. No.: WO2022/058583
PCT Pub. Date: Mar. 24, 2022

(65) Prior Publication Data
US 2023/0344447 A1 Oct. 26, 2023

(30) Foreign Application Priority Data
Sep. 18, 2020 (EP) .................................... 20197038

(51) Int. Cl.
*H03M 7/00* (2006.01)
*H03M 7/30* (2006.01)
(52) U.S. Cl.
CPC ....... *H03M 7/6011* (2013.01); *H03M 7/3064* (2013.01); *H03M 7/3077* (2013.01); *H03M 7/6005* (2013.01)

(58) Field of Classification Search
CPC . H03M 7/6011; H03M 7/3077; H03M 7/6005
(Continued)

(56) References Cited

U.S. PATENT DOCUMENTS

| | | |
|---|---|---|
| 6,137,584 A | 10/2000 | Seidel et al. |
| 10,073,034 B2 | 9/2018 | Widzgowski |

(Continued)

FOREIGN PATENT DOCUMENTS

| | | |
|---|---|---|
| CN | 1 786 939 A | 6/2006 |
| EP | 0 941 466 B1 | 9/1999 |
| WO | 2004/044563 A1 | 5/2004 |

OTHER PUBLICATIONS

Kapusta, Peter & Wahl, Michael & Erdmann, Rainer. May 2015. Advanced Photon Counting: Applications, Methods, Instrumentation. 10.1007/978-3-319-15636-1. pp. 9-14, Springer Cham, Switzerland.

(Continued)

*Primary Examiner* — Peguy Jean Pierre
(74) *Attorney, Agent, or Firm* — LEYDIG, VOIT & MAYER, LTD.

(57) ABSTRACT

A computer-implemented method for compression of Time Tagged data including Time Tagged data records includes the step of separating the Time Tagged data records into a plurality of groups. The method also includes sorting the Time Tagged data records in at least one of the groups by a photon arrival time. The method also includes subtracting a content of a record by a content of an adjacent record resulting in modified records. The method also includes compressing the modified records with a compression method.

13 Claims, 6 Drawing Sheets

(58) Field of Classification Search
USPC ...................................................... 341/50.51
See application file for complete search history.

(56) References Cited

U.S. PATENT DOCUMENTS

| | | | |
|---|---|---|---|
| 10,520,434 | B2 | 12/2019 | Seyfried et al. |
| 12,190,206 | B2* | 1/2025 | Semo ..................... H01S 3/042 |
| 2013/0126755 | A1 | 5/2013 | Kemnitz |
| 2020/0233752 | A1* | 7/2020 | Wong .................. G06F 11/1453 |
| 2023/0009841 | A1* | 1/2023 | Khuat .................... G06N 20/00 |

OTHER PUBLICATIONS

Patting, Matthias et al., Dead-time effects in TCSPC data analysis, Proc. of SPIE vol. 6583, pp. 658307-1-658307-10, May 11, 2007, SPIE, US.

Alvarez, Luis et al. (2019). SP8 Falcon: a novel concept in fluorescence lifetime imaging enabling video-rate confocal FLIM. Nature Methods. 16, UK, Oct. 2019, pp. 1-4.

Salomon, David & Motta, Giovanni. (2010). Handbook of Data Compression (5. ed.). 10.1007/978-1-84882-903-9, Springer-Verlag, London, Dec. 2010, pp. 1-1370.

Collet, Y. and M. Kucherawy, Ed., "Zstandard Compression and the application/zstd Media Type", RFC 8478, DOI 10.17487/RFC8478, Oct. 2018, pp. 1-54, IETF, US.

Funasaka, Shunji, Nakano, Koji & Ito, Yasuaki. Aug. 2017. Adaptive loss-less data compression method optimized for GPU decompression. Concurrency and Computation: Practice and Experience. 29. e4283. 10.1002/cpe.4283, Wiley InterScience, US, pp. 1-15.

Weißenberger, André & Schmidt, Bertil. Aug. 13-16, 2018. Massively Parallel Huffman Decoding on GPUs. ICPP 2018: Proceedings of the 47th International Conference on Parallel Processing. 1-10. 10.1145/3225058.3225076, US, pp. 1-10.

Knuth, Donald E., Chapter 5.3.4. Networks for Sorting, Dec. 1998. The Art Of Computer Programming, vol. 3 Sorting and Searching, pp. 219-247, Addison-Wesley, US.

Chenggang Zhen et al.: "Design and Realization of Data Compression in Real-Time Database", CISE 2009, Dec. 11, 2009, IEEE, US, pp. 1-4, XP031591102.

Margara et al.: "High-accuracy and video-rate lifetime extraction from time correlated single photon counting data on a graphical processing unit", Review of Scientific Instruments, American Institute of Physics, 2 Huntington Quadrangle, Melville, NY 11747, vol. 90, No. 10, Oct. 29, 2019 (Oct. 29, 2019), XP012241791, pp. 104709-1-104709-9.

Peronio et al.: "32-channel time-correlated-single-photon-counting system for high-throughput lifetime imaging", Review of Scientific Instruments, American Institute of Physics, 2 Huntington Quadrangle, Melville, NY 11747, vol. 88, No. 8, Aug. 25, 2017 (Aug. 25, 2017), XP012221610, pp. 083704-1-083704-8.

* cited by examiner

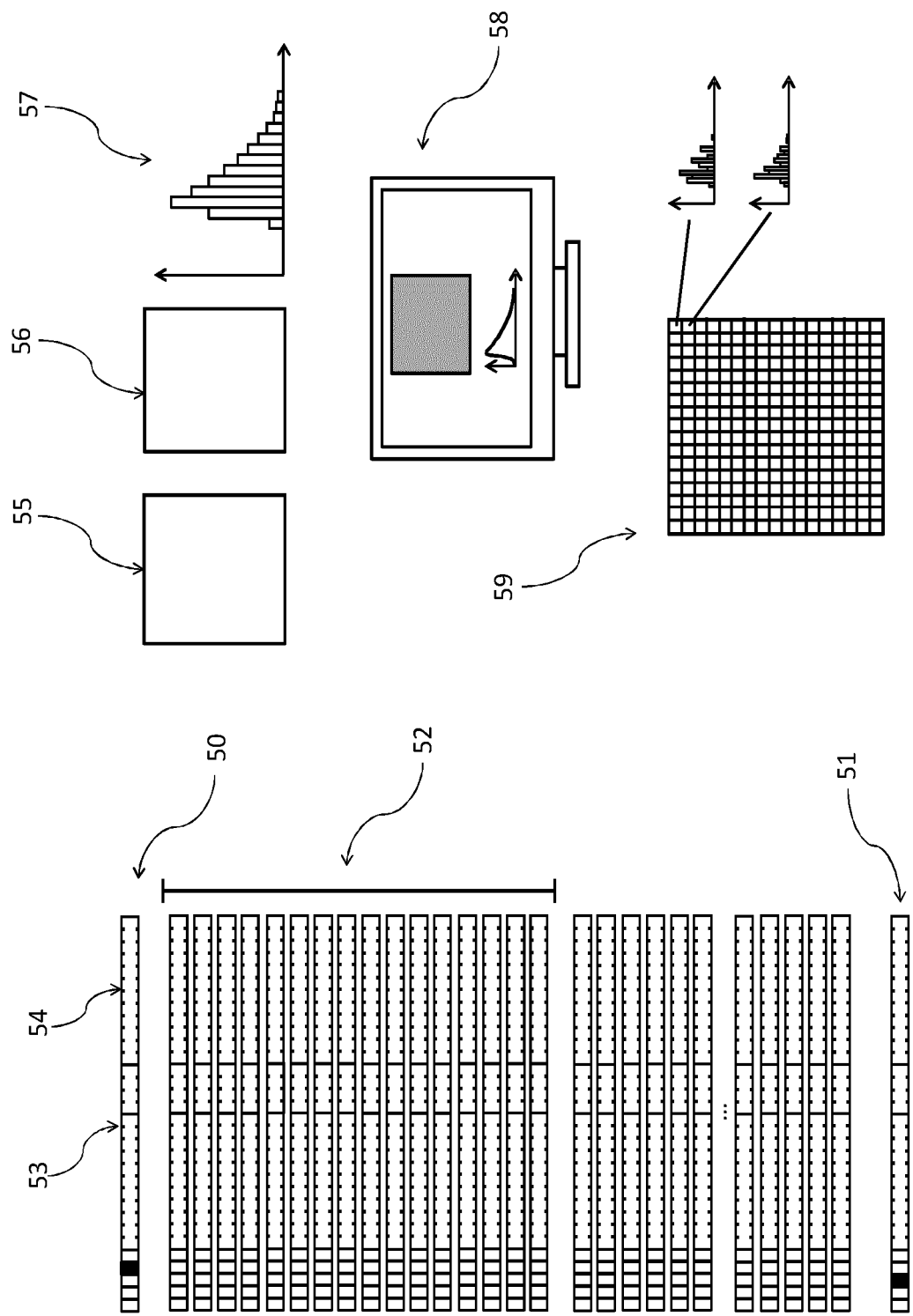

Fig. 4

Table 60:

| 61 → | 16 | 50 | 17 | 31 | 34 | 109 | 37 | 53 | 26 | 36 | 29 | 43 | 14 | 33 | 34 | 41 | 26 | 14 | 75 | 18 | 20 | 55 | 28 | 27 | 33 | 28 | 19 | 18 | 31 | 29 | 37 | 28 |
|---|---|---|---|---|---|---|---|---|---|---|---|---|---|---|---|---|---|---|---|---|---|---|---|---|---|---|---|---|---|---|---|---|
| 62 → | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 63 → | 2343 | 2344 | 2346 | 2347 | 2347 | 2348 | 2350 | 2351 | 2351 | 2352 | 2354 | 2355 | 2356 | 2356 | 2357 | 2359 | 2360 | 2360 | 2361 | 2363 | 2364 | 2364 | 2365 | 2367 | 2368 | 2369 | 2370 | 2370 | 2372 | 2373 | 2374 | 2375 |

Table 64:

| 14 | 14 | 16 | 17 | 18 | 18 | 19 | 20 | 26 | 26 | 27 | 28 | 28 | 28 | 29 | 29 | 31 | 31 | 33 | 33 | 34 | 34 | 36 | 37 | 37 | 41 | 43 | 50 | 53 | 55 | 75 | 109 |
|---|---|---|---|---|---|---|---|---|---|---|---|---|---|---|---|---|---|---|---|---|---|---|---|---|---|---|---|---|---|---|---|
| 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 2356 | 2360 | 2343 | 2346 | 2363 | 2370 | 2370 | 2364 | 2351 | 2360 | 2367 | 2365 | 2369 | 2375 | 2354 | 2373 | 2347 | 2372 | 2356 | 2368 | 2347 | 2357 | 2352 | 2350 | 2374 | 2359 | 2355 | 2344 | 2351 | 2364 | 2361 | 2348 |

Table 65:

| 14 | 0 | 2 | 1 | 1 | 0 | 1 | 1 | 6 | 0 | 1 | 1 | 0 | 0 | 1 | 0 | 2 | 0 | 2 | 0 | 2 | 1 | 0 | 2 | 1 | 0 | 4 | 2 | 7 | 3 | 2 | 20 | 34 |
|---|---|---|---|---|---|---|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 2356 | 4 | -17 | 3 | 17 | 7 | 0 | -6 | -13 | 9 | 7 | -2 | 4 | 6 | -11 | 19 | -26 | 25 | -16 | 12 | -21 | 10 | -5 | -2 | 24 | -15 | -4 | -11 | 8 | 13 | -3 | -13 | |

METHOD FOR COMPRESSION OF TIME TAGGED DATA FROM TIME CORRELATED SINGLE PHOTON COUNTING

CROSS REFERENCE TO RELATED APPLICATIONS

This application is a U.S. National Phase application under 35 U.S.C. § 371 of International Application No. PCT/EP2021/075779, filed on Sep. 20, 2021, and claims benefit to European Patent Application No. EP 20197038.1, filed on Sep. 18, 2020. The International Application was published in English on Mar. 24, 2022 as WO 2022/058583 A1 under PCT Article 21(2).

FIELD

The invention relates to a method for improvement of the handling of raw data obtained by Time Correlated Single Photon Counting instruments.

BACKGROUND

A Time Correlated Single Photon Counting (abbreviated TCSPC) instrument, like described in EP 0 941 466 B1, records the arrival time of the individual photons relative to the light pulse of a pulsed light source.

These instruments are frequently used in fluorescence lifetime imaging microscopy (abbreviated FLIM) where the different lifetimes of the excited states of fluorescent molecules are measured and properties of the environment like pH, ion concentration and transition by energy transfer are determined. Such instruments are also used in fluorescence correlation spectroscopy (abbreviated FCS) which provides insights to molecular mobility and binding.

For FLIM applications the instruments are usually part of or are combined with a confocal scanning microscope or a multiphoton microscope.

For the transfer and storing of the acquired data a Time Tagged data format is advantageous and popular due to minimal memory requirements for the dedicated electronics of the instrument and the flexibility for the data analysis. A detailed description of one of the possible implementations of a Time Tagged data format for TCSPC devices is contained in Kapusta, Peter & Wahl, Michael & Erdmann, Rainer. (2015). Advanced Photon Counting: Applications, Methods, Instrumentation. 10.1007/978-3-319-15636-1. pp. 9-14.

Recently TCSPC instruments have been developed which allow the recording of FLIM data at a speed comparable to conventional confocal microscope intensity acquisitions. In U.S. Pat. No. 10,073,034 B2 the photon arrival time is sampled by GHz samplers which allows FLIM at high count rates and therefore reduces the acquisition time. U.S. Pat. No. 10,520,434 B2 and Patting, Matthias, Dead-time effects in TCSPC data analysis, Proc. of SPIE Vol. 6583, 658307, (2007), describe methods that compensate for the dead time effects at high count rates.

A full integration of FLIM into the acquisition and analysis software of a confocal microscope, as described in Alvarez, Luis et. al. (2019). SP8 FALCON: a novel concept in fluorescence lifetime imaging enabling video-rate confocal FLIM. Nature Methods. 16, allows the recording and analysis of FLIM data in all acquisition modes including 3D-stacks, time-series and large area mosaics. In Life-Science the so obtained larger amount of data is often required to discover trends based on statistics.

The additional dimension "Lifetime" leads to more than one order of magnitude larger data sets. The acquisition of 100 GB of Time Tagged data within an hour is not unusual. The data have to be transferred to analysis workstations. They have to be analyzed and archived.

A wide variety of compression methods are known. Salomon, David & Motta, Giovanni. (2010). Handbook of Data Compression (5. ed.). 10.1007/978-1-84882-903-9 contains the detailed description of the frequently used methods. A lossless compression is preferred due to traceability requirements. Although rather old, Huffman coding (Chapter 6.3) and Deflate (Chapter 6.25) are still very popular. Due to the random nature of photon arrival times, Time Tagged data cannot be compressed very well with these methods. There are cases where not even a reduction by factor 2 can be achieved. In addition, encoder and decoder should operate faster than the storage medium and network transfer speed. Standard software libraries are too slow.

The recently developed compression library ZStandard (Collet, Y. and M. Kucherawy, Ed., "Zstandard Compression and the application/zstd Media Type", RFC 8478, DOI 10.17487/RFC8478) achieves excellent encoding speed at reasonable compression ratio in the fastest mode. The decoder speed is not optimal for this application but acceptable.

Several solutions for accelerated compression and decompression on GPUs have been published. Funasaka, Shunji & Nakano, Koji & Ito, Yasuaki. (2017). Adaptive loss-less data compression method optimized for GPU decompression. Concurrency and Computation: Practice and Experience. 29. e4283. 10.1002/cpe.4283. describes a new method for fast decompression on GPUs. The estimated compression and published decompression speed of the ALL method meets the speed requirements.

A Huffman decompressor on GPU has been published in Weißenberger, André & Schmidt, Bertil. (2018). Massively Parallel Huffman Decoding on GPUs. ICPP 2018: Proceedings of the 47th International Conference on Parallel Processing. 1-10. 10.1145/3225058.3225076. Huffman coding is combined with a sliding window dictionary method in Deflate and is therefore only part of a desired and standardized compression method.

While encoding and decoding at a speed faster than a typical storage medium can be achieved, the compression ratio is not good enough for many Time Tagged data sets in FLIM applications with the known methods.

SUMMARY

In an embodiment, the present disclosure provides a computer-implemented method for compression of Time Tagged data including Time Tagged data records. The method includes the step of separating the Time Tagged data records into a plurality of groups. The method also includes sorting the Time Tagged data records in at least one of the groups by a photon arrival time. The method also includes subtracting a content of a record by a content of an adjacent record resulting in modified records. The method also includes compressing the modified records with a compression method.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following:

FIG. 3 illustrates the processing of Time Tagged data to generate an overall decay curve and corresponding mean arrival time image as well as the process to generate the decay data for a FLIM image fit;

FIG. 4. illustrates the effect that is achieved by the modification of Time Tagged according to an embodiment of the current invention;

DETAILED DESCRIPTION

Figure 1:
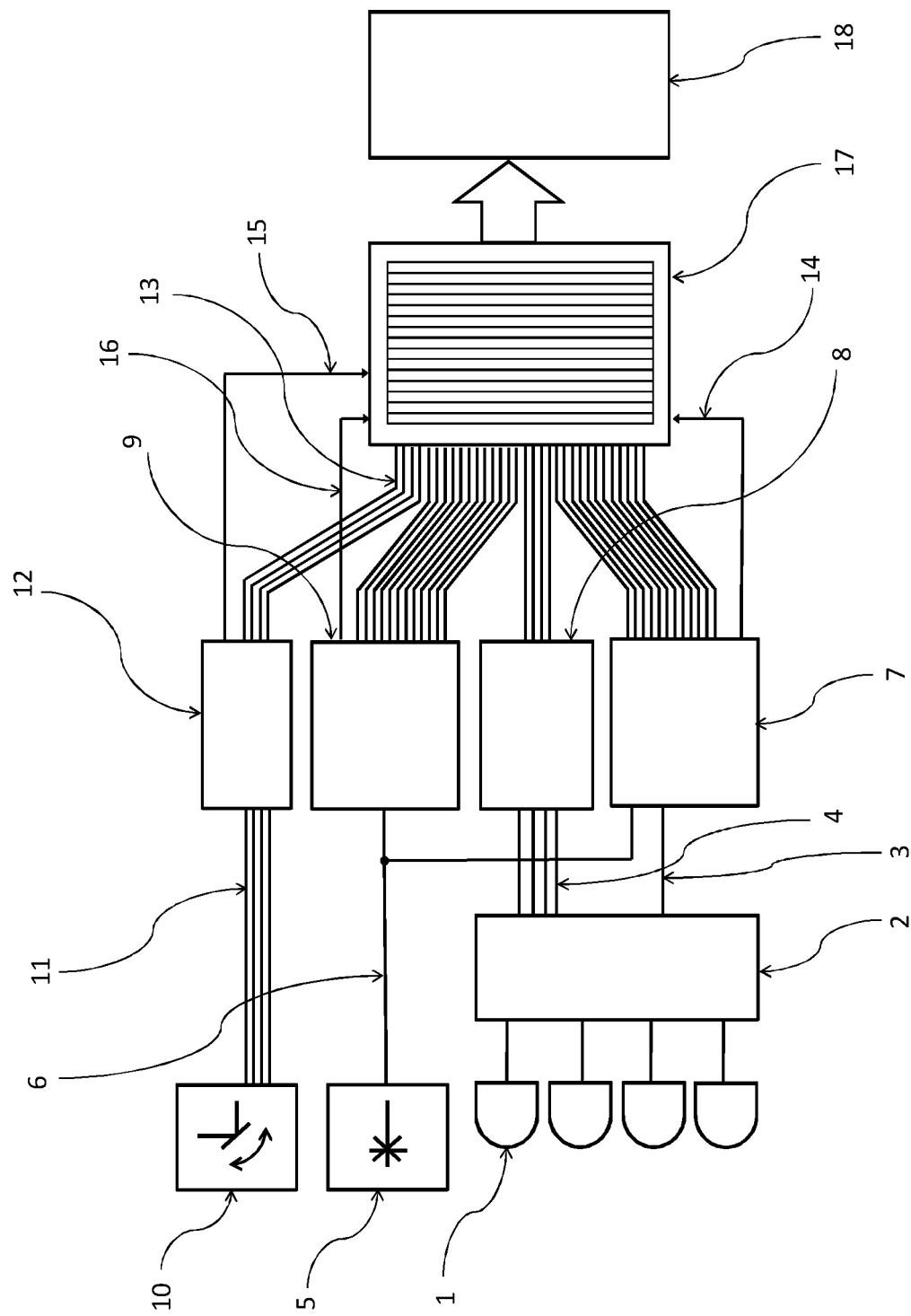
FIG. 1 shows the building blocks of a TCSPC instrument that generates Time Tagged data.

Embodiments of the present invention can provide a method for the compression of Time Tagged data that achieves high compression ratios at a speed faster than the storage medium and network. Embodiments can also provide a method for faster analyzing of FLIM data in Time Tagged format by reduction of the access time to the raw data.

This can be achieved by:

Method for the compression of Time Tagged data comprising Time Tagged data records, the method comprising the steps of:
  a) separating the Time Tagged data records into a plurality of groups,
  b) sorting of the Time Tagged data records in at least one of the groups by a photon arrival time,
  c) subtracting a content of a record (in the group) by a content of an adjacent record (in the group) resulting in modified records, and
  d) compressing the modified records with a compression method.

The compression method may be a conventional compression method.

The so modified data compress substantially better, and surprisingly, also with simple compression methods and with methods that can efficiently run massive parallel.

Each Time Tagged data record may comprise at least one photon arrival time. A group in step a) can be regarded as a part of the Time Tagged data. In some instances, it might be possible not to carry out step a), i.e. the separation into groups. The content mentioned in step c) can be at least one value or information contained in a Time Tagged data record, e.g. the photon arrival time. An alternative for step c) mentioned above could be for example to obtain modified records based from a content of a record in the group and a content of an adjacent record in the group.

In a preferred embodiment, the records are classified into classes (e.g. data of a pixel, records from different detectors or types of photons) and the classes are separately processed in at least one of the steps a) to d) as mentioned above.

A bit depth of the records could be reduced after the subtracting step c).

The Time Tagged data could be derived from the acquisition with an TCSPC instrument.

In a preferred embodiment, the compression method is a lossless compression method.

A method for decompression of Time Tagged data compressed by the method mentioned above can be provided, wherein at least the steps d) and c) of the method mentioned above are carried out in an inverse manner.

In a preferred method for decompression of Time Tagged data, compressed data are transferred to a memory of a GPU. The data could be decompressed on the GPU and—preferably after an overall decay and a mean arrival time image have been generated on the GPU—could be made available for further analysis or display.

A device can be adapted to carry out the method as mentioned above, wherein the device is, in a preferred embodiment, a confocal or multiphoton microscope.

As used herein the term "and/or" includes any and all combinations of one or more of the associated listed items and may be abbreviated as "/".

Although some aspects have been described in the context of an apparatus, it is clear that these aspects also represent a description of the corresponding method, where a block or device corresponds to a method step or a feature of a method step. Analogously, aspects described in the context of a method step also represents a description of a corresponding block or item or feature of a corresponding apparatus.

A computer program comprising program code can provided for, when executed on a processor, performing the method as mentioned above or to operate a device as mentioned above.

Some or all of the method steps may be executed by (or using) a hardware apparatus, like for example, a processor, a microprocessor, a programmable computer or an electronic circuit. In some embodiments, some or more of the most important method steps may be executed by such an apparatus.

Depending on certain implementation requirements, embodiments of the invention can be implemented in hardware or in software. The implementation can be performed using a non-transitory storage medium such as a digital storage medium, for example a floppy disc, a DVD, a Blu-Ray, a CD, a ROM, a PROM, and EPROM, an EEPROM or a FLASH memory, having electronically readable control signals stored thereon, which cooperate (or are capable of cooperating) with a programmable computer system such that the respective method is performed. Therefore, the digital storage medium may be computer readable.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may, for example, be stored on a machine readable carrier.

Other embodiments comprise the computer program for performing one of the methods described herein, stored on a machine readable carrier.

In other words, an embodiment of the present invention is, therefore, a computer program having a program code for performing one of the methods described herein, when the computer program runs on a computer.

A further embodiment of the present invention is, therefore, a storage medium (or a data carrier, or a computer-readable medium) comprising, stored thereon, the computer program for performing one of the methods described herein when it is performed by a processor. The data carrier, the digital storage medium or the recorded medium are typically tangible and/or non-transitionary. A further embodiment of the present invention is an apparatus as described herein comprising a processor and the storage medium.

A further embodiment of the invention is, therefore, a data stream or a sequence of signals representing the computer program for performing one of the methods described herein. The data stream or the sequence of signals may, for example, be configured to be transferred via a data communication connection, for example, via the internet.

A further embodiment comprises a processing means, for example, a computer or a programmable logic device, configured to, or adapted to, perform one of the methods described herein.

A further embodiment comprises a computer having installed thereon the computer program for performing one of the methods described herein.

A further embodiment according to the invention comprises an apparatus or a system configured to transfer (for example, electronically or optically) a computer program for performing one of the methods described herein to a receiver. The receiver may, for example, be a computer, a mobile device, a memory device or the like. The apparatus or system may, for example, comprise a file server for transferring the computer program to the receiver.

In some embodiments, a programmable logic device (for example, a field programmable gate array) may be used to perform some or all of the functionalities of the methods described herein. In some embodiments, a field programmable gate array may cooperate with a microprocessor in order to perform one of the methods described herein. Generally, the methods are preferably performed by any hardware apparatus.

There is a wide variety for the layout of instruments that generate data, which can be processed by embodiments of the method of the present invention. As an example, the building blocks of a typical TCSPC instrument that generates Time Tagged data are shown in FIG. 1. The signal from one or multiple counting detectors 1 is processed by a router 2. The output of the router 2 is for example detector signal 3 and detector signal 4 that identify the detector where the signal originated. A pulsed light source 5 (e.g. a laser light source operated in pulsed mode) provides an electrical signal 6 which correlates with light pulses being emitted by the light source 5. A time measuring unit 7 determines the photon arrival time relative to a previous light (or laser) pulse from the time difference between the signal 6 from light source 5 and the signal 3 from the detector. A latch 8 stores the information for identification of the detector to synchronize the output of this data with the output of the time measuring unit 7. A counter 9 counts the pulses of the light source. The scanning electronics 10 of the instrument, e.g. a confocal or multiphoton microscope, provides signals 11 for at least the start and end time of a scanned line. The delay unit 12 again takes care that the information is in synchronization with the output signals of the other units. The output data 13 of the units are combined to a Time Tagged record. The three signals 14, 15 and 16 cause that the output data 13 are latched into FIFO 17. Signal 14 is sent when a photon has been detected and the arrival time has been determined. Signal 15 is sent when a line start- or end signal from the scanner electronics was detected. When the counter in counting unit 9 overflows, a dedicated bit is set at the output and signal 16 is sent. When the FIFO load reaches a certain level data from the FIFO are sent to the processing and analysis unit 18.

Figure 2A:
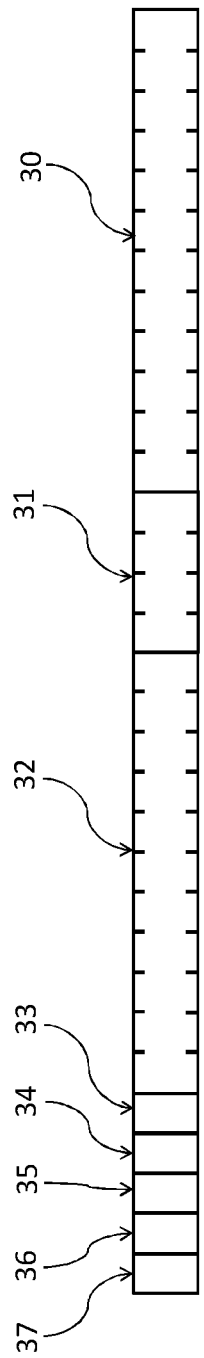
FIGS. 2a to 2c show typical layouts of the data records for two variants of Time Tagged data.

The records generated by the instrument can have different bit assignments and bit widths. For example, in the instrument shown in FIG. 1, each record stores 32 bits. The corresponding record bit layout is shown in FIG. 2a. The lower bits 30 contain the arrival time of the photons relative to the laser pulse in multiples of the time resolution of the time measuring unit 7. The four bits 31 contain detector information from which of the detectors the signal has been detected. Then follow bits with the counter value 32 from the laser pulse counter 9. The single bit 33 is set when a counter overflow occurred. The bits numbered 34 to 37 contain signals from the scanner electronics 10 with bits indicating line start and line end.

A photon record is a record which represents a detected photon. Records which have been latched into the FIFO 17 by line 15 or 16 originating from counter or scanner electronics do not represent a detected photon and are called marker records. A software marker record is a record that has been inserted into the stream of records after recording and during processing of the data. It is beneficial, but not necessary, for embodiments of the method according to the present invention that all records have the same bit width.

The term "Time Tagged" is used differently in the Literature. Similar terms are "event recording", "time stamp recording" and "FIFO mode". In this document the term Time Tagged data is used when the data consist of a sequence of records and the photon arrival time is stored in individual records.

Figure 2B:
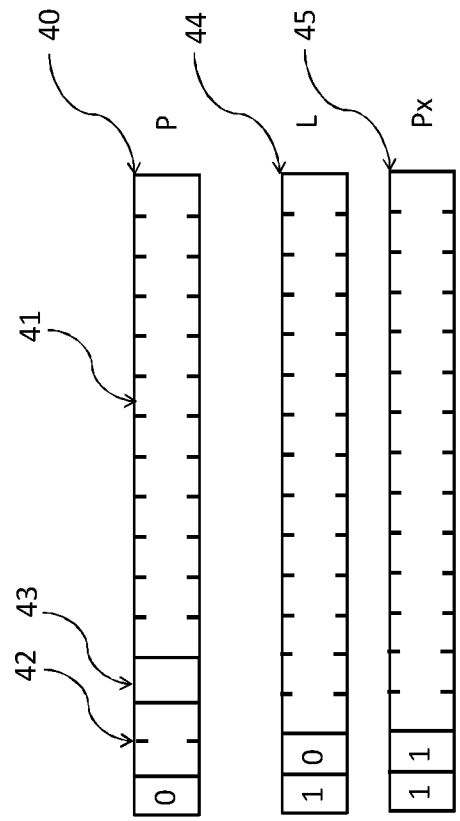
Figure 2C:
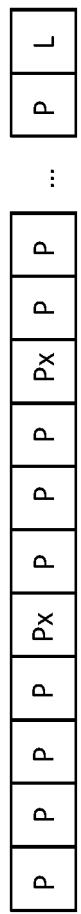

The format of the data from the example in FIG. 2a can be used for a wide range of application including FLIM and FCS. For FLIM applications where the data are not intended to be analyzed with other methods the laser pulse counter value requires storage space with considerable low content. A format which reduces the storage space is here called a "reduced Time Tagged" format. An example is shown in FIG. 2b. A photon record 40 stores the arrival time of the photon in lower bits 41 and the information about the detector in bits 42. The bit 43 is e.g. used to store the information if the photon was the first photon after the laser pulse. This allows the implementation of the method from U.S. Pat. No. 10,520,434 B2. An unused bit pattern for a line end marker 44 is chosen. The pixel marker 45 is generated when a pixel clock signal is received from the scanner electronics within a scanning line. FIG. 2c shows a typical sequence of records for a "reduced Time Tagged" format. The photon records are separated by pixel markers. Only one line marker may be required to mark e.g. the end of the line. The 16 bits per record are sufficient for most of the FLIM applications.

FIG. 3 illustrates the processing of FLIM data from the records in a not reduced Time Tagged format. The records between start marker record 50 and end marker record 51 are divided into blocks of equal time period representing an image pixel duration 52 with the use of the time information for laser pulse counter 53 and the arrival time 54. The mean of all arrival time values 54 is written into one image 55. The number of photon records is written to a second image 56. From the two images 55 and 56 a third image is generated and displayed on a monitor 58 with the intensity of the image 56 and the color derived from the image 55 e.g. with the use of a rainbow lookup table. In addition, a histogram 57 of all arrival time values from all records in the image is generated and displayed. The histogram is called the overall decay. The user performs fit of the data in the overall decay and derives fixed or start parameters for an image fit. For the image fit a histogram of arrival time values for each of the pixels in the image 59 is generated from the arrival time data 54. A fit is performed per image pixel. Other analysis methods are known. The extraction of the information from the Time Tagged data may be similar there.

Embodiments of the method according to the present invention are now described. The first step a) is the separation of the records into groups. The separation can be simply a separation by fixed number of adjacent records from the data stream. In FIG. 4 one group of 32 records 60 with the corresponding data for arrival time 61, detector 62 and laser pulse 63 is shown. The separation can also include a classification of the records. Possible classes could be e.g. records from different detectors or types of photons. Records for different classes can e.g. be marked by inserting a software marker record at the start.

In the second step b) with result 64 the records in the group are sorted by the arrival time 61. Since the sorting can be a bottleneck for the performance of the application of the method, an algorithm for processing of several groups in parallel is preferred but not mandatory. An Implementation of the inventive method can use sorting networks according Chapter 5.3.4. Networks for Sorting in Knuth, D. (1998). The Art Of Computer Programming, Vol. 3 Sorting and Searching. It is obvious for someone skilled in the art that efficient sorting can be implemented with several other methods and means like FPGAs and computing units with massive parallel architecture like GPUs.

In the next step c) with result 65 the difference of the content or values of the current record minus the content or values of the previous record is calculated. The result replaces the original value of the record. The processing begins with the last record backwards to the second. The first record of the group remains.

The numbers in the records are now smaller in average. Large numbers are rare. In an optional next step, the number of bits per record can be reduced. The 32-bit records in the group 65 can e.g. be reduced to 16-bit records by omitting bits with zeros. For the rare numbers that are too large a software marker can be inserted. The software marker can e.g. contain the upper bits of the rare number and the record with the lower bits follows.

The final step d) for the encoder is the application of a—in a preferred embodiment, conventional—compression method. The term compression method is used here for any method that generates output data with reduced size compared to the input data.

When the so compressed data are analyzed, in a first step the decoder of the used conventional compression method can be applied. When a bit depth reduction has been done, it can be undone now. Then the subtraction is undone by adding the value of the current record to the value of the previous record. The result are groups with sorted values 64. The mean arrival time value 61 and the pulse counter value 63 are combined to a global time value which is used to identify the image pixel. From image pixel and arrival time the results for mean arrival time image, intensity image, overall decay and per pixel decay histograms for the image fit are calculated.

In a preferred embodiment reduced Time Tag data according FIG. 2b are compressed. The photon records for one pixel are grouped by detector and photon type. The photon type distinguish photons where only this one photon has been detected between laser pulses from all other photons according U.S. Pat. No. 10,520,434 B2. A software marker is inserted into the data stream to mark the start of photon records of a particular class.

Figure 5:
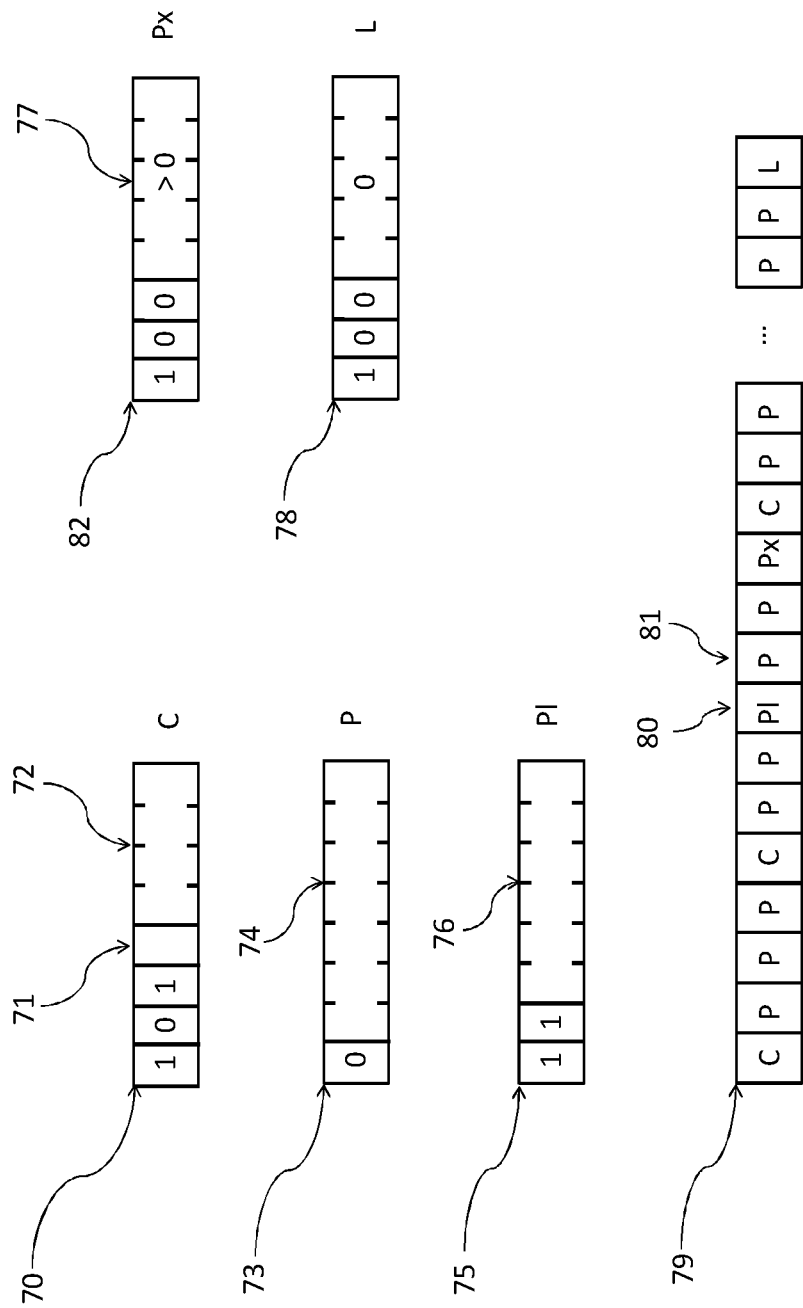
FIG. 5. illustrates the coding format that is used by a preferred embodiment.

The records of one class are grouped to up to 32 records. The records in the group are sorted by arrival time. Then the records are replaced by the arrival time differences to the predecessor. The records are then reduced from 16-bit per record to 8 bits per record as shown in FIG. 5. A class record 70 contains one bit 71, which is set for classes with single photon between laser pulses and four bits 72 for the identification of the detector. A photon record 73 contains seven bits 74 of the arrival time. For large arrival time numbers an additional record 75 with the upper six bits 76 is inserted. A pixel end marker 82 can contain a run length value 77 which is larger than one if no photon has been detected in pixels. The line end marker 78 marks the start of the next line. In the example record sequence 79 is shown that the class marker C comes first. Then follow the photon records P for the class. In the second class is a photon with large arrival time coded (Pl). The marker 80 contains the upper six bits and the next photon record 81 contains the lower seven bits. The so converted data stream is compressed with Deflate. Px denotes the start of the next pixel.

Figure 6:
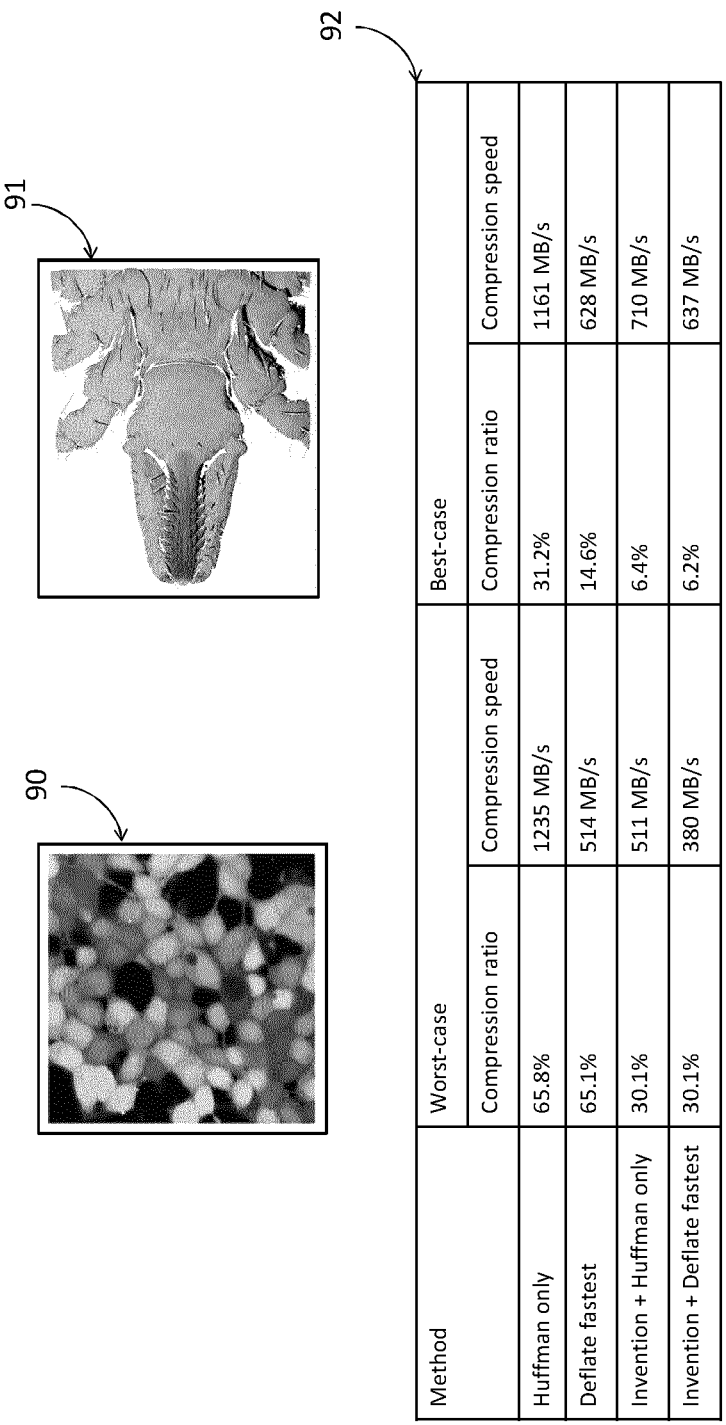
FIG. 6. lists the achieved compression ratio and speed for different embodiments.

FIG. 6 shows performance results for two selected data sets. The worst-case data set 90 is a time series of 34 GB uncompressed data and about 200 photons in bright pixels. The best-case data set 91 is a 3D acquisition with 29 GB uncompressed data. The data sets have been compressed with an own implementation of Deflate with and without the inventive method for the described preferred embodiment. In addition, a compression variant where the sliding window part of Deflate is disabled was tested again with and without the inventive method. This "Huffman only" variant generates a compressed data stream that is still compliant to the Deflate specification.

The single threaded performance results 92 show that embodiments of the inventive method achieves more than factor 2 better compression for both data sets. Unexpectedly, the compression ratio is almost the same with and without the sliding window component of Deflate when embodiments of the inventive method is applied. This is an interesting fact. It allows the use of entropy encoding only without considerable drawback. Entropy encoding can run on computing units with massive parallel architecture efficiently.

A preferred embodiment considers this phenomenon and uses the Deflate method with entropy coding only. It does not generate the length/distance codes of the sliding window component. It still generates a Deflate compliant data stream. The analysis of the compressed data in the preferred embodiment is performed by transfer of the compressed data to the memory of a GPU. The data are decompressed on the GPU with the use of the method by Weißenberger and Schmidt. Overall decay and mean arrival time image are generated on the GPU and then transferred back to host memory. This way part of the analysis can be performed faster than the access speed of the storage medium of the compressed data.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A computer-implemented method for compression of Time Tagged data comprising Time Tagged data records, the method comprising the steps of:
   a) separating the Time Tagged data records into a plurality of groups;
   b) sorting the Time Tagged data records in at least one of the groups by a photon arrival time;
   c) subtracting a content of a record by a content of an adjacent record resulting in modified records; and
   d) compressing the modified records with a compression method.

2. The method of claim 1, wherein the compression method is a conventional compression method.

3. The method of claim 1, wherein the records are classified into classes, and wherein the classes are separately processed in at least one of the steps of claim 1.

4. The method of claim 3, wherein the classes are at least one of data of a pixel, records from different detectors, or types of photons.

5. The method of claim 1, wherein a bit depth of the records is reduced after the subtracting step c).

6. The method according to claim 1, wherein the Time Tagged data are derived from acquisition with a Time Correlated Single Photon Counting (TCSPC) instrument.

7. The method according to claim 1, wherein the compression method is a lossless compression method.

8. A computer-implemented method for decompression of Time Tagged data compressed by the method according to claim 1, wherein the steps d) and c) of claim 1 or are carried out in an inverse manner.

9. The method according to claim 8, wherein compressed data are transferred to a memory of a GPU, wherein the compressed data are decompressed on the GPU and are made available for further analysis or display.

10. The method according to claim 9, wherein the decompressed data are made available for further analysis or display after an overall decay and a mean arrival time image have been generated on the GPU.

11. A device being adapted to carry out the method according to claim 1, wherein the device is a confocal or multiphoton microscope.

12. A non-transitory computer-readable medium storing program code that, when executed on a processor, facilitates performance of the method according to claim 1.

13. A computer-implemented method for decompression of the Time Tagged data compressed by a method according to claim 1, wherein the steps d) and c) of claim 1 are carried out such that step c) is carried out before step d).

* * * * *